(12) United States Patent
Matsuo et al.

(10) Patent No.: US 6,960,964 B2
(45) Date of Patent: Nov. 1, 2005

(54) OSCILLATOR

(75) Inventors: Nobuaki Matsuo, Yokohama (JP); Alejandro Puel, San Jose, CA (US)

(73) Assignee: Fujitsu Media Devices Limited, Yokohama (JP)

( * ) Notice: Subject to any disclaimer, the term of this patent is extended or adjusted under 35 U.S.C. 154(b) by 81 days.

(21) Appl. No.: 10/717,900

(22) Filed: Nov. 21, 2003

(65) Prior Publication Data

US 2005/0110582 A1 May 26, 2005

(51) Int. Cl.$^7$ .............................. H03B 5/12; H03B 5/18
(52) U.S. Cl. ................. 331/117 R; 331/96; 331/117 D; 331/117 V
(58) Field of Search ................. 331/36 C, 96, 331/117 R, 117 FE, 117 D, 177 V (56) References Cited

U.S. PATENT DOCUMENTS 5,808,531 A * 9/1998 Nakano ........................ 334/15
5,945,884 A * 8/1999 Nakatsuka ............... 331/117 R
5,973,575 A * 10/1999 Kamogawa et al. ..... 331/117 R

FOREIGN PATENT DOCUMENTS

| JP | 63-209306 | | 8/1988 |
| JP | 64-5513 | | 1/1989 |
| JP | 200332037 A | * | 1/2003 |
| JP | 2003-163538 | | 6/2003 |

* cited by examiner

Primary Examiner—David Mis
(74) Attorney, Agent, or Firm—Arent Fox PLLC (57) ABSTRACT

An oscillator includes a transistor having a collector receiving a power supply voltage, a first capacitor connected between a base and an emitter of the transistor, a second capacitor connected between the first capacitor and ground, a resistor connected between the collector and base of the transistor, a first inductor connected between the base of the transistor and ground, and a second inductor connected to the emitter of the transistor and the first inductor.

13 Claims, 9 Drawing Sheets

Fig. 9

OSCILLATOR

BACKGROUND OF THE INVENTION

1. Field of the Invention

The present invention generally relates to oscillators, and more particularly, to an oscillator suitable for radio-frequency (RF) circuits.

2. Description of the Related Art

Conventionally, various types of oscillators such as a local oscillator for FM tuners, a crystal oscillator, and a voltage-controlled oscillator are used. A Colpittz oscillator and a Hartley oscillator are known as LC oscillators. The LC oscillator employs a resonant circuit by the combination of an inductor L and a capacitor C. The LC resonant circuit is capable of generating an oscillation signal over a wide frequency range. Generally, a buffer circuit follows the LC oscillation circuit of the oscillator in order to stabilize oscillation.

Recently, there has been considerable activity in the development of downsized oscillators due to downsizing of electronic devices. However, the oscillator composed of the oscillation circuit and the buffer circuit has reached the limit of downsizing.

Figure 1:
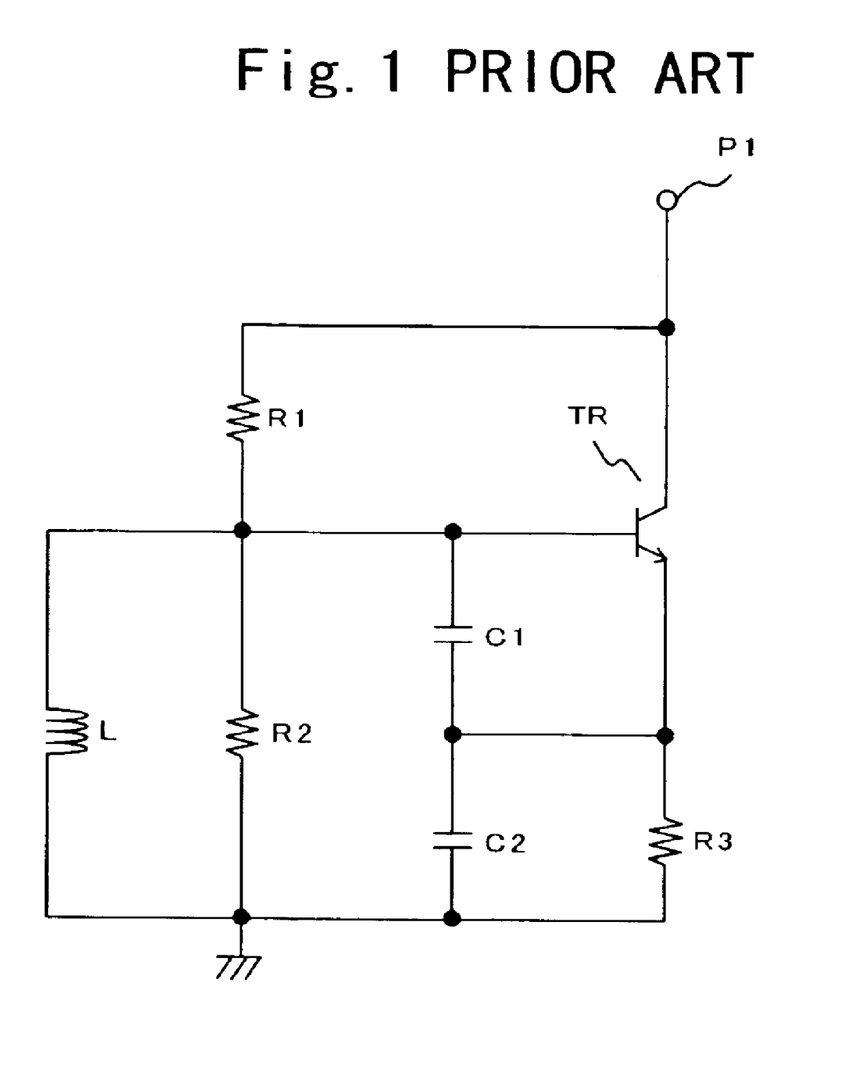
FIG. 1 is a circuit diagram of a conventional Colpittz oscillator.

FIG. 1 is a circuit diagram of a conventional Colpittz oscillation circuit. The Colpittz oscillator circuit is made up of a transistor TR, feedback-use capacitors C1 and C2, resistors R1, R2 and R3 and an inductor L. A power supply voltage is applied to the oscillator via a terminal P1. A series circuit of the resistors R1 and R2 is connected between the terminal P1 and ground, and generates a DC bias voltage, which is applied to the base of the transistor TR. The emitter is biased by the resistor R3 that serves as an emitter bias resistor. A buffer circuit (not shown) follows the Colpittz oscillation circuit. More particularly, the buffer circuit is connected to the emitter of the transistor TR.

It is required to realize downsizing the oscillator without degrading the electrical characteristics.

SUMMARY OF THE INVENTION

It is a general object of the present invention to provide a downsized oscillator having a new circuit configuration without degrading the electrical characteristics.

This object of the present invention is achieved by an oscillator including: a transistor having a collector receiving a power supply voltage; a first capacitor connected between a base and an emitter of the transistor; a second capacitor connected between the first capacitor and ground; a resistor connected between the collector and the base of the transistor; a first inductor connected between the base of the transistor and ground; and a second inductor connected to the emitter of the transistor and the first inductor.

BRIEF DESCRIPTION OF THE DRAWINGS

Other objects, features and advantages of the present invention will become more apparent from the following detailed description when read in conjunction with the accompanying drawings in which like reference numerals refer to like elements throughout, wherein.

DESCRIPTION OF THE PREFERRED EMBODIMENTS

A description will now be given of embodiments of the invention.

First Embodiment

Figure 2:
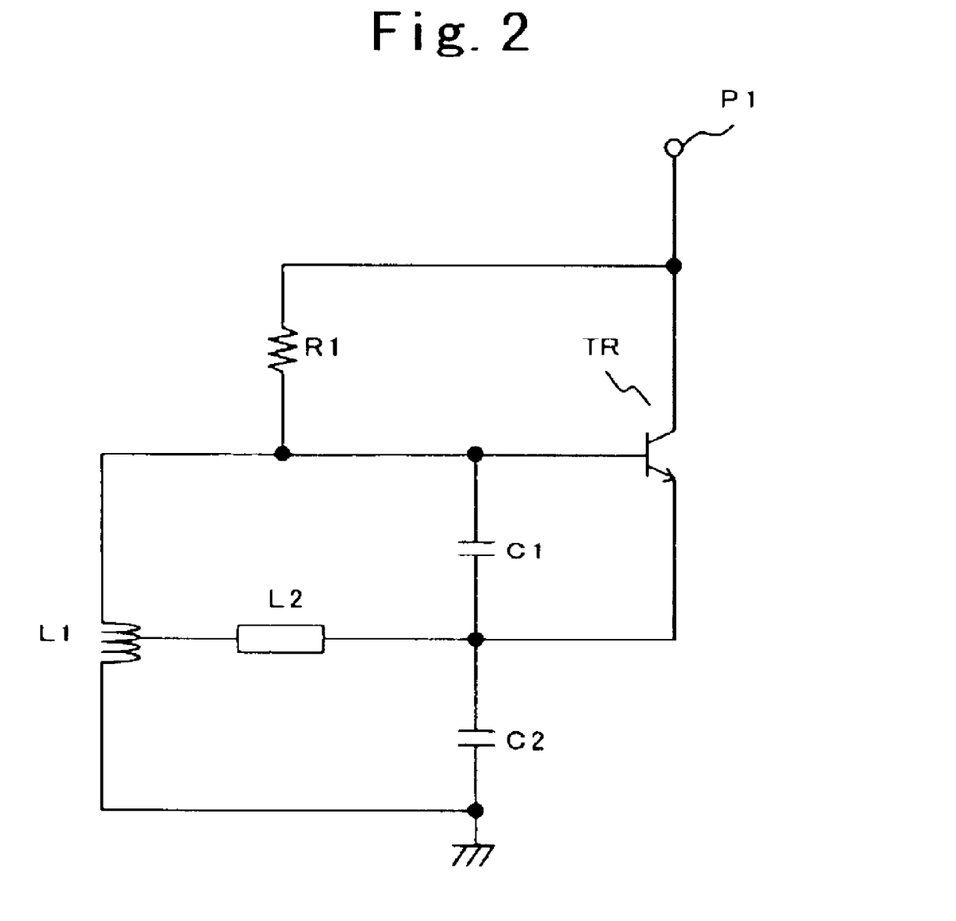
FIG. 2 is a circuit diagram of an oscillator according to a first embodiment of the present invention.

FIG. 2 is a circuit diagram of an oscillator according to a first embodiment of the present invention. The oscillator shown in FIG. 2 is a variation of the Colpittz oscillator, which is configured as follows. The collector of the transistor TR for use in feedback receives the power supply voltage applied via the power supply terminal P1. The first capacitor C1 is connected between the base and the emitter of the transistor TR. The second capacitor C2 is connected between the first capacitor C1 and ground. The resistor R1 is connected between the collector and the base of the transistor TR. The first inductor L1 of the resonant circuit is connected between the base of the transistor TR and ground. A second inductor L2 is connected between the emitter of the transistor TR and the first inductor L1.

It is to be noted that the circuit configuration shown in FIG. 2 does not have the bias resistor R2 connected between the base of the transistor TR and ground shown in FIG. 1 and the bias resistor R3 connected between the base and ground. Thus, the bias circuit of the first embodiment is simplified. It will be seen from the comparison between FIGS. 1 and 2 that the circuit shown in FIG. 2 is made up of a smaller number of components than the circuit shown in FIG. 1. Thus, the downsized oscillator can be realized.

The emitter of the transistor TR is grounded via the inductor L2, the one end of which is connected to the emitter, and the other end is connected to an intermediate node of the inductor L1. The inductor L2 allows a DC current to flows through it and blocks high-frequency components. Thus, the inductor L2 operates like a choke coil. The other end of the inductor L2 may be grounded directly without the inductor L1. The inventors have confirmed that the circuit configuration shown in FIG. 2 oscillates.

The components shown in FIG. 2 may be mounted on a common substrate or chip, which may be packaged. This structure will be described in detail later.

Second Embodiment

Figure 3:
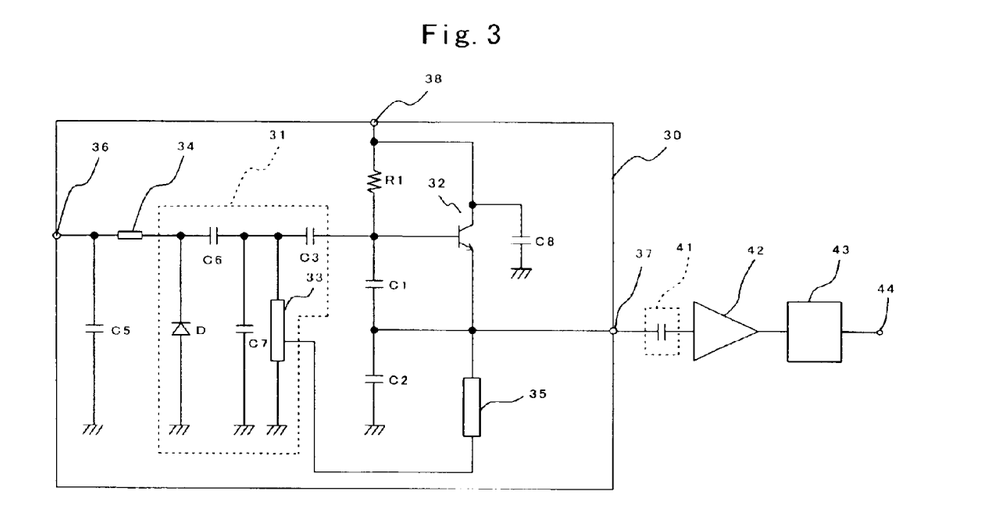
FIG. 3 is a circuit diagram of an oscillator according to a second embodiment of the present invention.

FIG. 3 shows an oscillator according to a second embodiment of the present invention. The oscillator includes an oscillation circuit 30, a matching circuit 41, a buffer circuit 42, and an impedance adjustment circuit 43. The oscillation circuit 30 generates an oscillation signal, which is applied to an output terminal 44 via the matching circuit 41, the buffer circuit 42 and the impedance adjustment circuit 43. The matching circuit 41 functions to DC-isolate the oscillation circuit 30 from the buffer circuit 42. When the oscillation signal has frequencies as high as a few GHz, it is preferable to employ the matching circuit 41. The buffer circuit 42 amplifies the oscillation signal. The impedance adjustment circuit 43 establishes the impedance matching between the oscillator and an external circuit connected to the output terminal 44.

The oscillation circuit 30 includes a resonant circuit 31 and a drive circuit having an oscillation transistor 32. The resonant circuit 31 generates a resonant signal. The oscillation transistor 32 feeds the resonant signal back to the resonant circuit 31 to drive the resonant circuit 31. The resonant circuit 31 is an LC resonant circuit. More particularly, the resonant circuit 31 is made up of a diode D, capacitors C3, C6 and C7 and an inductor 33. The diode D may be a variable capacitance diode. A control signal is externally applied to the cathode of the diode D via the control terminal 36 and an inductor 34, which is a choke coil. The anode of the diode D is grounded. The control signal changes the capacitance of the diode D, this changing the resonant frequency of the resonator 31. An AC component applied to the control terminal 36 flows to ground via a bypass capacitor C5. The cathode of the diode D is grounded via the capacitors C6 and C7. One end of the inductor 33 is coupled to the cathode of the diode D via the capacitor C6, and the other end of the inductor 33 is grounded. The inductor 33 is connected in parallel with the capacitor C7. The resonant frequency mainly depends on the diode D, the capacitors C6 and C7 and the inductor 33. The capacitor C3, which is connected between the inductor 22 and the base of the transistor 32, is provided for impedance adjustment.

The node, at which the capacitors C1 and C2 are connected in series, is connected to an output terminal 37 of the oscillation circuit 30. The oscillation signal from the output terminal 37 is applied to the output terminal 44 of the oscillator according to the matching circuit 41, the buffer circuit 42 and the impedance adjustment circuit 43.

The base voltage is defined by the resistor R1 connected between a power supply terminal 38 and ground in the DC circuitry. A power supply voltage is applied to the power supply terminal 38. The Colpittz oscillator includes the transistor 32, and the capacitors C1 and C2. The capacitor C1 is connected between the base and the emitter of the transistor 32. The capacitor C2 is connected between the emitter of the transistor 32 and ground. An inductor 35, which corresponds to the inductor L2 shown in FIG. 1, is connected between the emitter of the transistor 32 and the intermediate node of the inductor 33. The emitter of the transistor 32 is grounded via the inductor 35 and a part of the inductor 33 in the DC circuitry. A bypass capacitor C8 is connected to the collector of the transistor 32 and ground. The collector of the transistor 32 is connected to the power supply terminal 38.

In operation, the resonant signal generated by the resonant circuit 31 is applied to the base of the transistor 32. The emitter output is then fed back to the resonant circuit 31 via the inductor 35. The oscillation signal, which can be by the control signal applied to the control terminal 36, is output via the output terminal 37.

Since the oscillation circuit 30 is made up of a smaller number of components, so that the oscillator can be downsized.

Third Embodiment

Figure 4:
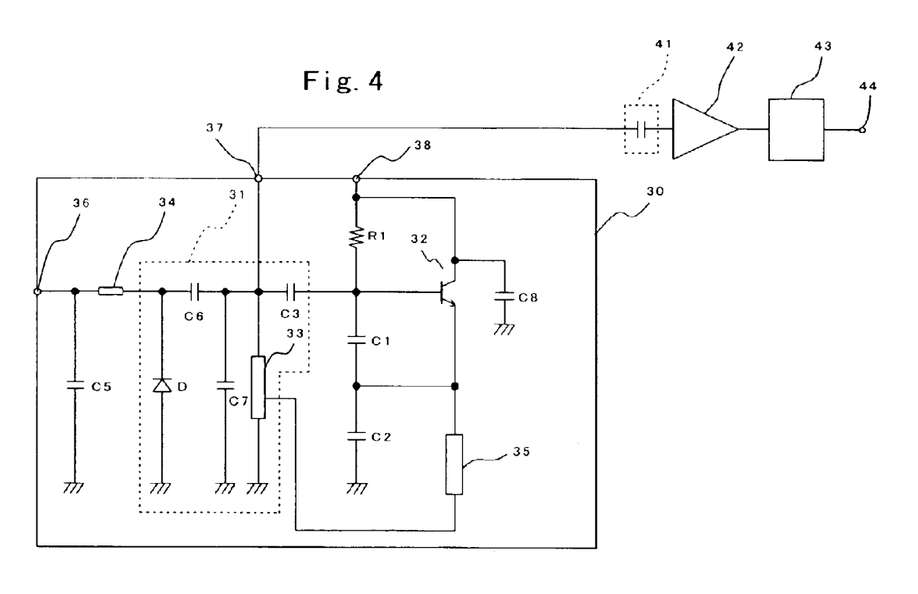
FIG. 4 is a circuit diagram of an oscillator according to a third embodiment of the present invention.

FIG. 4 is a circuit diagram of an oscillator according to a third embodiment of the present invention.

The output terminal 37 is connected to the node at which the inductor 33 and the capacitors C3, C6 and C7 are connected. That is, the oscillation output is extracted from the resonant circuit 31. The resonant signal available at the inductor 33 is relatively large. The buffer circuit 42 receives the oscillation (resonant) signal via the output terminal 37 and amplifies it.

Fourth Embodiment

Figure 5:
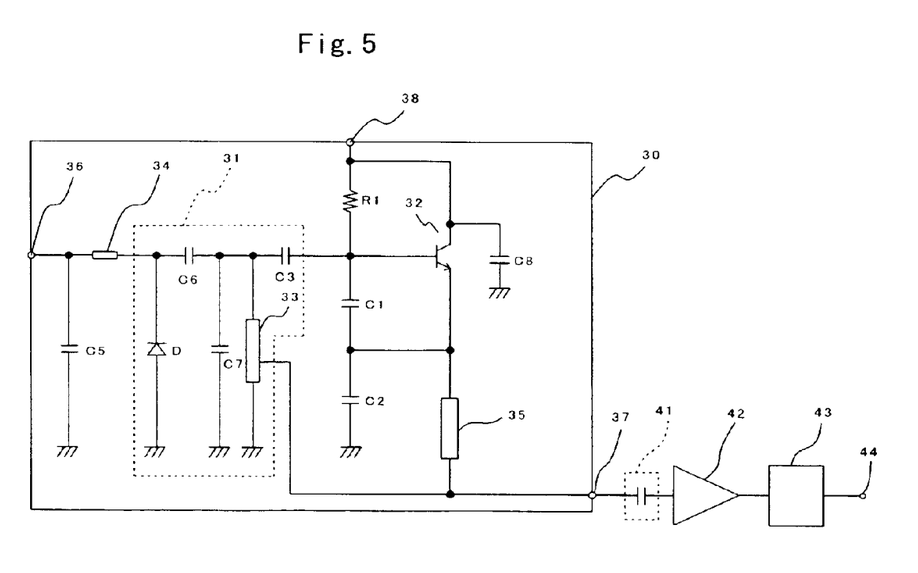
FIG. 5 is a circuit diagram of an oscillator according to a fourth embodiment of the present invention.

FIG. 5 is a circuit diagram of an oscillator according to a fourth embodiment of the present invention.

The oscillator shown FIG. 5 corresponds to a variation of the oscillator shown in FIG. 4. The output terminal 37 of the oscillator is connected to the intermediate node at which one end of the inductor 35 is connected. The buffer 42 amplifies the resonant signal available at the intermediate node.

Fifth Embodiment

Figure 6:
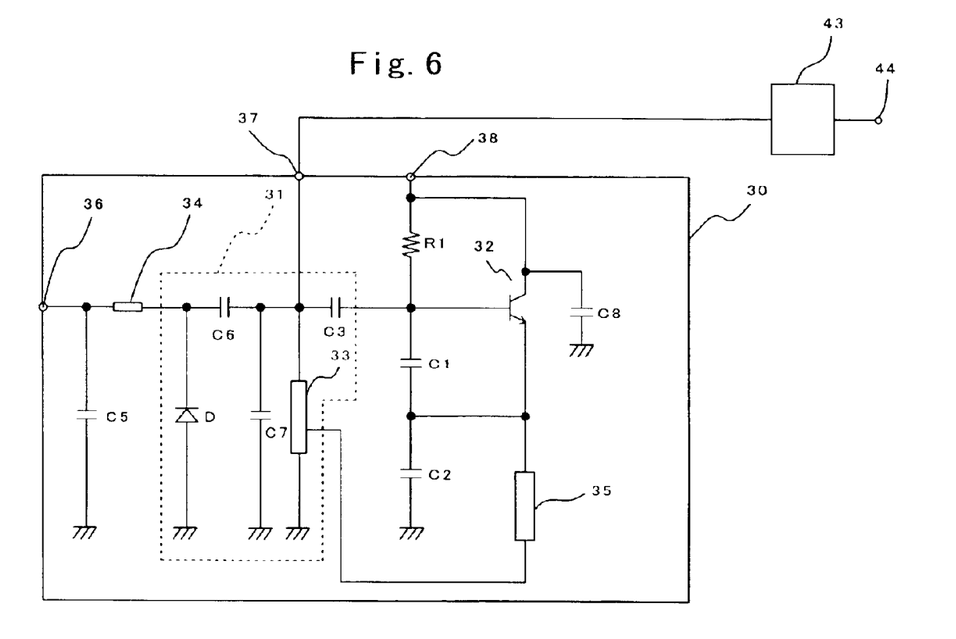
FIG. 6 is a circuit diagram of an oscillator according to a fifth embodiment of the present invention.

FIG. 6 is a circuit diagram of an oscillator according to a fifth embodiment of the present invention.

The oscillator shown in FIG. 6 is configured by omitting the matching circuit 41 and the buffer 42 used in the circuit shown in FIG. 4. If the resonant signal available at one end of the inductor 33 is large enough, the resonant signal may be used as the oscillation signal without any amplification. The oscillator shown in FIG. 6 is more compact than that shown in FIG. 4.

Sixth Embodiment

Figure 7:
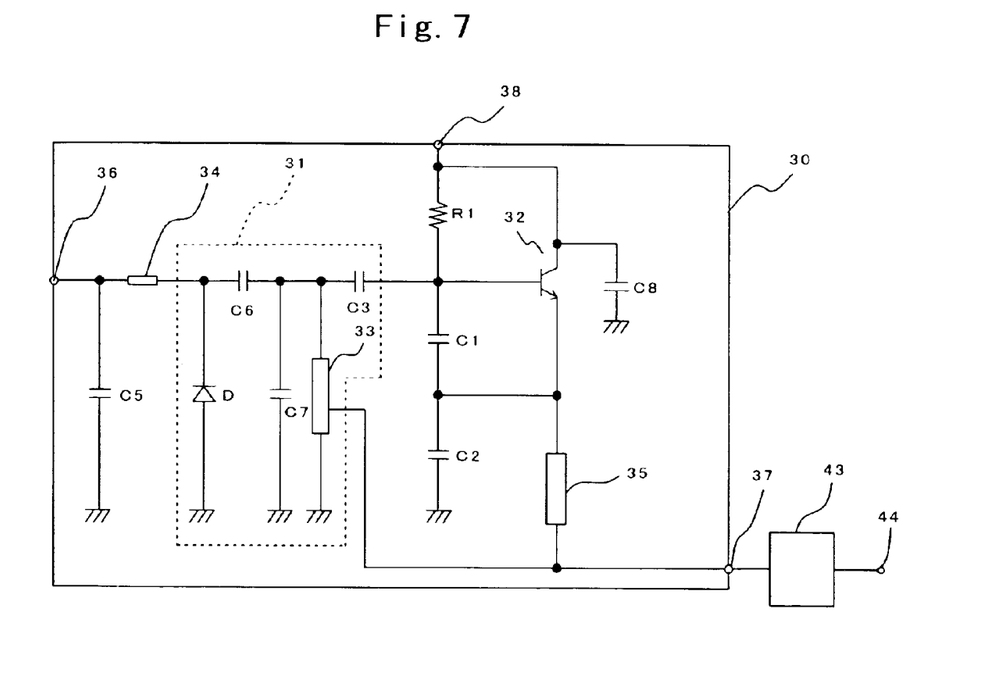
FIG. 7 is a circuit diagram of an oscillator according to a sixth embodiment of the present invention.

FIG. 7 is a circuit diagram of an oscillator according to a sixth embodiment of the present invention.

The oscillator shown in FIG. 7 is configured by omitting the matching circuit 41 and the buffer 42 used in the circuit shown in FIG. 5. If the resonant signal available at the intermediate node of the inductor 33 is large enough, the resonant signal may be used as the oscillation signal without any amplification. The oscillator shown in FIG. 7 is more compact than that shown in FIG. 5.

Figure 8:
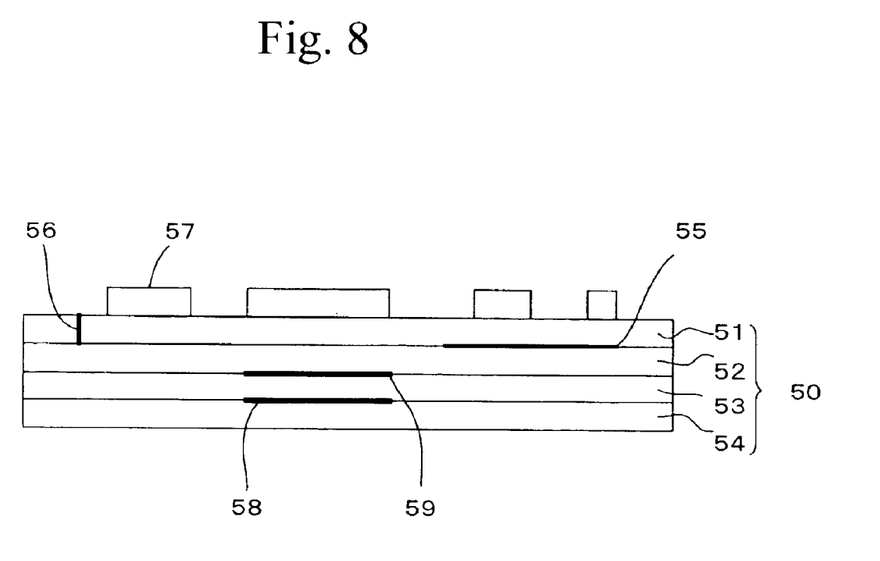
FIG. 8 schematically shows a cross section of a substrate used to realize the oscillators of the embodiments.

The oscillators of the first to sixth embodiments may be formed on a single substrate. FIG. 8 schematically shows a cross section of a substrate 50. The substrate 50 is a multi-layer substrate composed of layers 51–54 made of, for example, a ceramic material. Electronic parts 57 of the oscillator and pads for external connections are mounted on the top of the multilayer substrate 50. For example, the parts 57 are the transistor 32, capacitors C1–C3, C5, C6, C8, the buffer circuit 42 and the impedance matching circuit 43. A via hole 56 may be provided in any of the layers 51–54. A conductive pattern 55 may be provided at any interface between the adjacent layers. Preferably, the capacitor of the matching circuit 41 shown in FIGS. 2 through 5 may be incorporated in the multilayer substrate 50. In FIG. 8, two conductive patterns 58 and 59 face each other via the layer 53 and form the capacitor of the matching circuit 41.

A dielectric material may be additionally interposed between the conductive patterns 58 and 59. Alternatively, the layer sandwiched between the patterns 58 and 59 may be made of a dielectric material. It is not required that the conductive patterns 58 and 59 are dedicated to the capacitor 41, and may be parts of conductive patterns for making interconnections between parts. The capacitor 41 may also be formed by a pad on the top of the substrate 50 and a conductive pattern provided at the interface between the layers 51 and 52. The above pad on the top may be the output terminal 37. The capacitor 58 and 59 thus formed contribute to further downsizing of the oscillator because there is no need to define an area on the top of the substrate 50 for mounting the capacitor of the matching circuit 41. Also, the capacitor 41 may be formed by a circuit pattern formed on the substrate 50 although an area for mounting is needed on the substrate surface.

Figure 9:
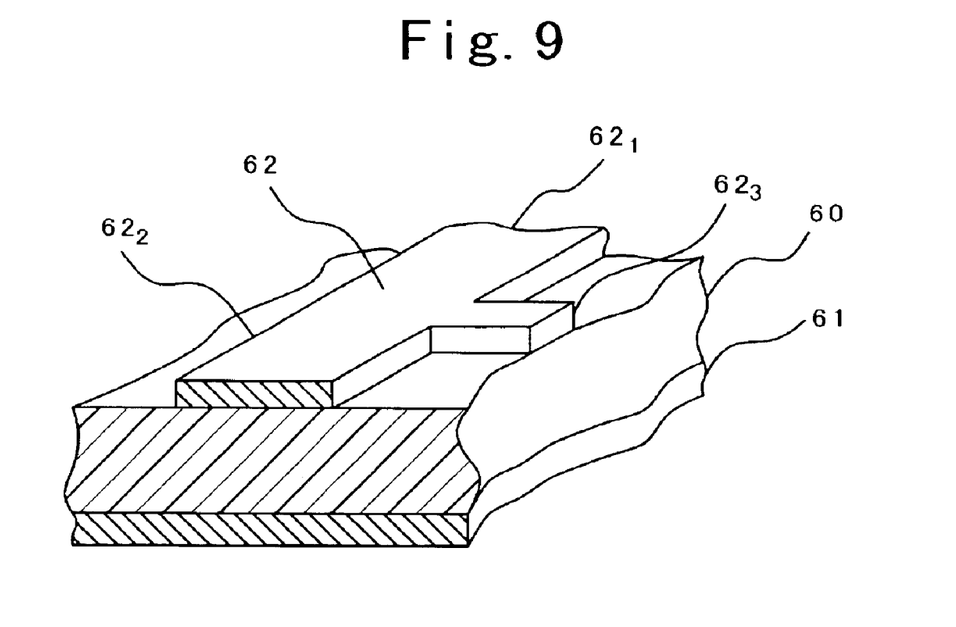
FIG. 9 schematically shows a micro stripline that forms an inductor employed in a resonant circuit of the oscillators of the first through sixth embodiments of the present invention.

FIG. 9 shows an example of the inductor 33 provided in the resonant circuit 31. The inductor 33 shown in FIG. 9 is formed by a transmission line. More particularly, the inductor 33 shown in FIG. 9 has a micro stripline, which has a substrate 60, a conductive pattern 62 formed on the front surface of the substrate 60, and a ground pattern 61 provided on the back surface thereof. A portion $62_2$ of the conductive pattern 62 is grounded and a portion $62_1$ is connected to the capacitors C3, C6 and C7. A portion $62_3$ of the pattern 62 is connected to the inductor 35, which may also be formed as shown in FIG. 9. The inductance value of the inductor 33 may be adjusted by trimming the conductive pattern 62. The transmission line shown in FIG. 9 may be provided on the top of the substrate 50 or may be incorporated therein. In the latter case, the substrate 60 may be a part of the substrate 50. Another type of micro stripline, for example, a triplate micro stripline may be formed within the multilayer substrate 50.

The resonant circuit 31 is not limited to the aforementioned circuit configuration. For example, the resonant circuit 31 may include a resonator formed by crystal or the like.

The present invention is not limited to the specifically disclosed embodiments, and other embodiments, variations and modifications may be made without departing from the scope of the present invention.

What is claimed is:

1. An oscillator comprising:

a transistor having a collector receiving a power supply voltage;

a first capacitor connected between a base and an emitter of the transistor;

a second capacitor connected between the first capacitor and ground;

a resistor connected between the collector and the base of the transistor;

a first inductor connected between the base of the transistor and ground; and a second inductor connected to the emitter of the transistor and the first inductor.

2. The oscillator as claimed in claim 1, wherein the second inductor is grounded via a part of the first inductor.

3. The oscillator as claimed in claim 1, further comprising an output terminal via which an oscillation signal is output, the output terminal being connected to one end of the first inductor.

4. The oscillator as claimed in claim 1, further comprising an output terminal via which an oscillation signal is output, the output terminal being connected to an intermediate node of the first inductor to which the second inductor is connected.

5. The oscillator as claimed in claim 1, further comprising:

an output terminal via which an oscillation signal is output, the output terminal being connected to one end of the first inductor; and a matching circuit that is connected to the output terminal and includes a third capacitor.

6. The oscillator as claimed in claim 1, further comprising:

an output terminal via which an oscillation signal is output, the output terminal being connected to an intermediate node the first inductor to which the second inductor is connected; and a matching circuit that is connected to the output terminal and includes a third capacitor.

7. The oscillator as claimed in claim 1, further comprising:

an output terminal via which an oscillation signal is output, the output terminal being connected to one end of the first inductor; and an impedance adjustment circuit connected to the output terminal.

8. The oscillator as claimed in claim 1, further comprising:

an output terminal via which an oscillation signal is output, the output terminal being connected to an intermediate node the first inductor to which the second inductor is connected; and an impedance adjustment circuit connected to the output terminal.

9. The oscillator as claimed in claim 5, further comprising a substrate on which the transistor is formed, the substrate having a conductive pattern that forms the third capacitor.

10. The oscillator as claimed in claim 6, further comprising a substrate on which the transistor is formed, the substrate having a conductive pattern that forms the third capacitor.

11. The oscillator as claimed in claim 1, wherein the first inductor comprises a transmission line.

12. The oscillator as claimed in claim 1, wherein the first inductor includes a micro stripline.

13. The oscillator as claimed in claim 1, further comprising a variable capacitance diode that is connected to the first inductor and receives a control signal via a control terminal of the oscillator, so that an oscillation frequency can be adjusted externally.

* * * * *